United States Patent [19]
Chou

[11] Patent Number: 5,286,668
[45] Date of Patent: Feb. 15, 1994

[54] PROCESS OF FABRICATING A HIGH CAPACITANCE STORAGE NODE

[75] Inventor: Hsiang-Ming J. Chou, Hsinchu, Taiwan

[73] Assignee: Industrial Technology Research Institute, Hsinchu, Taiwan

[21] Appl. No.: 13,064

[22] Filed: Feb. 3, 1993

[51] Int. Cl.$^5$ ............................................. H01L 21/70
[52] U.S. Cl. .................................. 437/52; 437/47; 437/60; 437/233; 437/919
[58] Field of Search ............... 437/47, 48, 52, 60, 437/233, 235, 919

[56] References Cited

U.S. PATENT DOCUMENTS

| | | | |
|---|---|---|---|
| 5,071,783 | 12/1991 | Taguchi et al. | 437/47 |
| 5,168,073 | 12/1992 | Gonzalez et al. | 437/52 |
| 5,215,930 | 6/1993 | Lee et al. | 437/40 |

Primary Examiner—Tom Thomas
Attorney, Agent, or Firm—George O. Saile

[57] ABSTRACT

A method for the fabrication of high density dynamic random access memory (DRAM) devices with particular emphasis on the capacitor formation. The capacitor is formed using layers of doped and undoped polysilicon. The layers are patterned anisotropically so as to have their remaining portions over the planned capacitor areas, wherein a portion of the layers remains over both the gate structure and the field oxide areas. Then selective etching of the portion of doped polysilicon layer is accomplished using phosphoric acid at a temperature of more than abut 140° C. to create an undercut of the undoped polysilicon layer. The capacitor is completed using a dielectric layer and a top electrode layer.

18 Claims, 6 Drawing Sheets

PROCESS OF FABRICATING A HIGH CAPACITANCE STORAGE NODE

BACKGROUND OF THE INVENTION (1.) Field of the Invention

This invention relates to the fabrication of integrated circuit devices and more particularly to a method of fabricating high density dynamic random access memory (DRAM) devices and the like, with particular emphasis upon the capacitor formation.

(2.) Description of the Prior Art

As DRAMs are scaled down in dimensions, there is a continuous challenge to maintain a sufficiently high stored charge per capacitor unit area. In order to construct high density DRAMs in a reasonable sized chip area, the cell structures have to change from the conventional planar-type capacitors to either trench capacitors or stack capacitors, in particular beyond the 4 Mbit DRAM era. All efforts to increase capacitance without increasing the planar area of the capacitor can be categorized into the following techniques:

(1) Thinning the capacitor dielectric and/or using films with a higher dielectric constant, such as oxide-nitride-oxide (ONO) films composite, and more recently tantalum pentoxide which will require further development to overcome leakage and reliability problems. (2) Building three dimensional capacitor structures to increase the capacitor area without increasing the planar area of the capacitor. There are two major branches of this approach, that is trench capacitors and stacked capacitors. In the category of trench capacitors, when the DRAM is beyond 16 Mbit, the trench needs to be very deep. There are technology and even theoretical physical limitations to processing the deep trenches that would be needed. When the stacked capacitor approach is used to fabricate 16 Mbit DRAMs and beyond, very complicated stacked structures are needed, such as fin structures, crown structures, and so forth. The making of such structures require complicated manufacturing processes which are costly and result in reduced yield.

SUMMARY OF THE INVENTION

A principal object of the invention is to provide an effective and very manufacturable method to fabricate a stacked capacitor device having an increased effective electrode surface area.

Another object of this invention is to provide an new method for producing a increased stacked surface on a silicon surface for use in highly dense capacitor structures using the difference in etching selectivity between heavily doped and undoped silicon.

The invention method begins by selectively forming relatively thick field oxide areas on the surface of a semiconductor substrate while leaving device areas for fabrication of field effect devices. A gate dielectric layer is formed on the substrate in the device areas. A relatively thick first layer of polysilicon is deposited on the field oxide areas and device areas. Portions of the first polysilicon layer are removed while leaving portions thereof for the gate structure in the device areas, and portions over the field oxide areas. Source/drain structures are formed within said device areas of the semiconductor substrate associated with the gate structures. A first oxide layer is formed over the device and field oxide areas. The capacitors are formed by forming openings to the desired source/drain structures by etching through the first oxide layer, wherein the opening extends over a portion of the first polysilicon layer of the gate structure and the field oxide areas. Then there is deposited a heavily doped second silicon layer over the device and field oxide areas. An undoped third polysilicon layer is deposited over the openings to the source/drain structures. Patterning anisotropically the second silicon and third polysilicon layers so as to have their remaining portions over the planned capacitor areas, wherein a portion of the layers remains over both the portion of the first polysilicon layer of the gate structure and the field oxide areas. Then removing by selective etching the portion of heavily doped second silicon layer to create an undercut of the undoped third polysilicon layer over both the portion of the first polysilicon layer of the gate structure and the field oxide areas and to construct the bottom storage node electrode of the desired capacitor. The remaining portions of bottom storage node electrode is doped. A capacitor dielectric layer is formed over the third polysilicon layer, and a fourth polysilicon layer is deposited thereover as the top plate electrode. The fourth polysilicon layer and the dielectric layer are patterned to complete the capacitor.

BRIEF DESCRIPTION OF THE DRAWINGS

In the accompanying drawings forming a material part of this description, there is shown.

DESCRIPTION OF THE PREFERRED EMBODIMENTS

Figure 1:
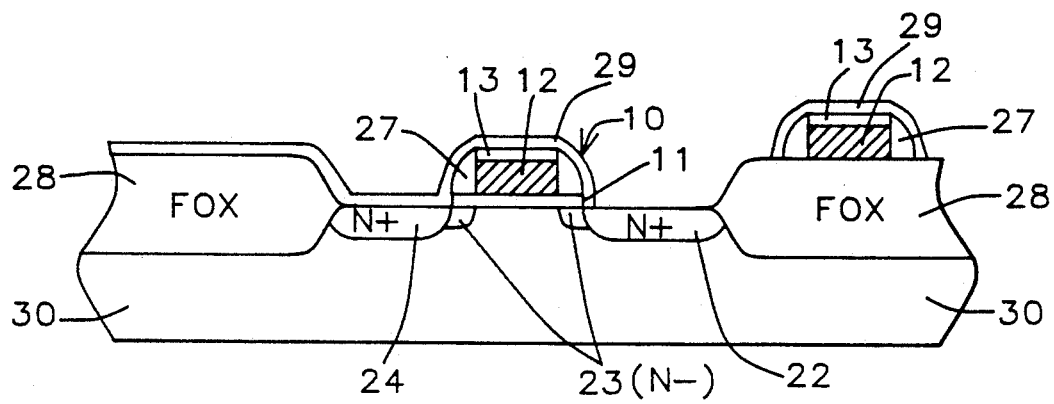
FIG. 1 through 7 schematically illustrate in cross-sectional representation one preferred method embodiment of this invention.

Referring now to FIG. 1, there is illustrated a partially completed DRAM structure upon which the new capacitor structure of the invention will be fabricated. The first series of steps involve the formation of the dielectric isolation regions for isolating semiconductor surface regions from other such regions in the semiconductor substrate 30. The semiconductor substrate is preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field OXide pattern, FOX 28. Then semiconductor devices can be provided in the silicon mesas according to the following processes.

The surface of the silicon substrate 30 is thermally oxidized to form the desired gate oxide 11 thickness. The preferred thickness is between about 80 to 200 Angstroms. The first polysilicon layer 12 is blanket deposited by LPCVD (Low Pressure Chemical Vapor Deposition) method. The preferred thickness of the first polysilicon layer 12 is between about 2000 to 4000 Angstroms. The first polysilicon layer 12 is ion implanted with phosphorous or arsenic ions under the conditions 5 to 10 E 15 dosage per cm$^2$ and 20 to 60 Kev. or doped with phosphorus oxychloride at a temperature about 900° C. The surface of the layer is either thermally oxidized or a chemical vapor deposition process to form silicon oxide layer 13. The layers 11, 12 and 13 are patterned by conventional lithography and anisotropic etching techniques as are conventional in the art to provide a desired pattern of gate electrodes for transistor 10 and structure on the FOX 28 surfaces or elsewhere as seen in FIG. 1.

The source/drain structure of the MOS FET 10 may now be formed by the following steps. The FIG. 1 illustrates the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate.

FIG. 1, for example shows the ion implantations of N- dopants. Lithographic masks may be required to protect the areas not to be subjected to that particular N- ion implantation. The formation of the lithographic masks are done by conventional lithography and etching techniques. The N- lightly doped drain implantation 23 are done with, for example phosphorous P31 at a dose of between about 1 to 10 E 13 atoms/cm.$^2$ and with an energy of between about 20 to 40 Kev.

The dielectric spacer 27 is now to be formed followed by the completion of the lightly doped drain source/drain structures. A low temperature silicon oxide deposition is preferred such as through the chemical vapor deposition of tetraethoxysilane (TEOS) at a temperature in the range of between about 650° to 900° C. Other silicon oxide deposition methods include silane based LPCVD. The thickness of the dielectric silicon dioxide layer 27 is between about 2000 to 5000 Angstroms and preferably about 2500 Angstroms.

An anisotropic etching of this layer produces the dielectric spacer layer 27 on the sidewalls of the layer structures 11, 12, 13. The preferred anisotropic etching uses a conventional reactive ion etching ambient.

A first thin silicon oxide, silicon nitride or the like masking layer 29 is formed upon the layer structure regions 11, 12, 13; the spacers 27 and the exposed monocrystalline silicon substrate regions. The conditions for forming this layer 29 are LPCVD deposition of TEOS or LPCVD silicon nitride deposition at about 600° to 900° C. or a composite layer of silicon oxide and nitride. The preferred thickness of this dielectric layer is between about 1000 to 2000 Angstroms and a preferred thickness of about 1500 Angstroms.

The N+ source/drain ion implantation uses Arsenic, As75 with a dose of between about 2 E 15 to 1 E 16 atoms/cm.$^2$ and energy of between about 20 to 70 Kev. to complete the source/drain regions 22 of the N channel lightly doped drain MOS FET integrated circuits device as seen in the FIG. 1.

Figure 2:
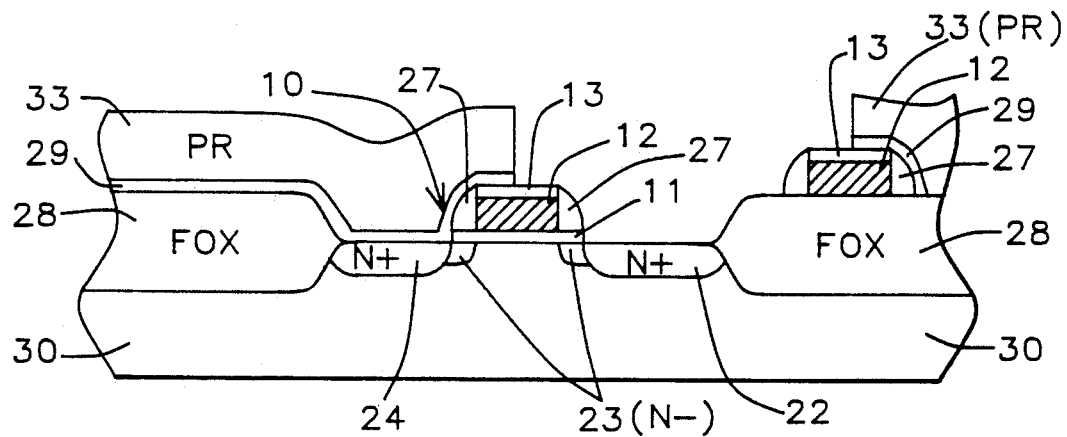

Referring now to FIGS. 2 though 6, the capacitor structure is fabricated. A lithography and etching process is performed using a photoresist mask 33 to remove portions of insulator layer 29 as seen in FIG. 2. It is preferred to extend the opening to above the first polysilicon layer 12 on the gate structure and on the FOX structure.

A second heavily doped silicon layer 32 over the surface of the opening to the source/drain region of FIG. 2 and the silicon oxide layer 29 using the deposition techniques of in situ doped with phosphorus low pressure chemical vapor deposition. This layer may either be formed as amorphous or polycrystalline. Later heating at a temperature of less than about 900° C. to assure uniform distribution of the impurity, optimum grain size of the silicon which is polycrystalline after heating. The thickness of the second layer is typically between about 1000 to 2000 Angstroms. A conductivity imparting and differential etching imparting impurity is introduced into the first layer, either by ion implantation techniques or in situ doping. The impurity concentration in this first layer 32 must be greater than about 1 E 19 atoms per cm.$^3$ to allow differential etching between undoped polysilicon and this heavily doped layer. The impurity concentration may be as high as 5 E 20 atoms per cm$^3$. Phosphorus, arsenic and boron dopants are effective for the subsequent phosphoric acid solution etching process. It is this heavy doping concentration uniformly throughout that allows the success of the differential and selective etching process over the undoped polysilicon. The structure is heated to a temperature of less than about 900° C. to assure uniform distribution of the impurities, optimum grain size of between about 500 to 1000 micrometers the silicon which is polycrystalline after the heating. Higher temperature heating causes slower etching in phosphoric acid which results in less selectivity between doped and undoped polysilicon.

Figure 3:
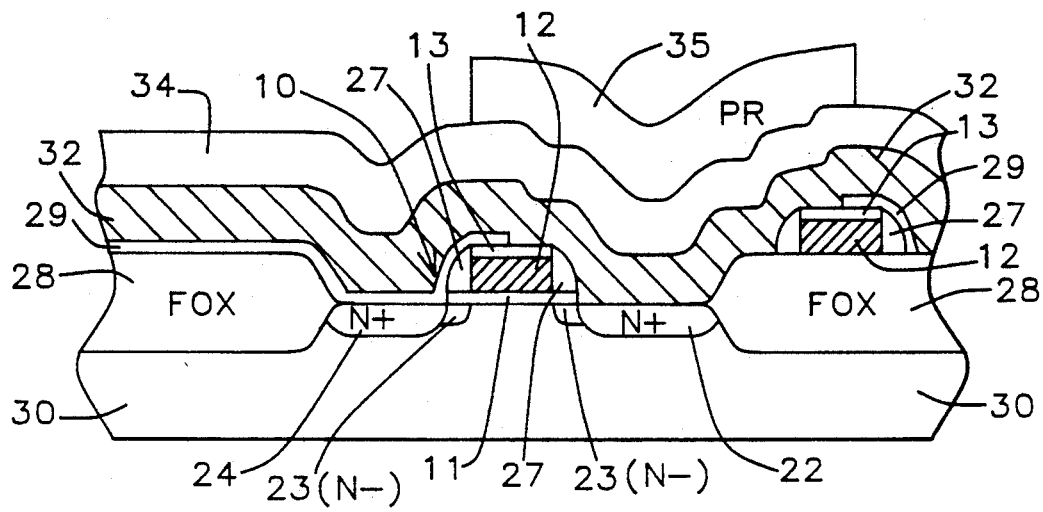
Figure 4:
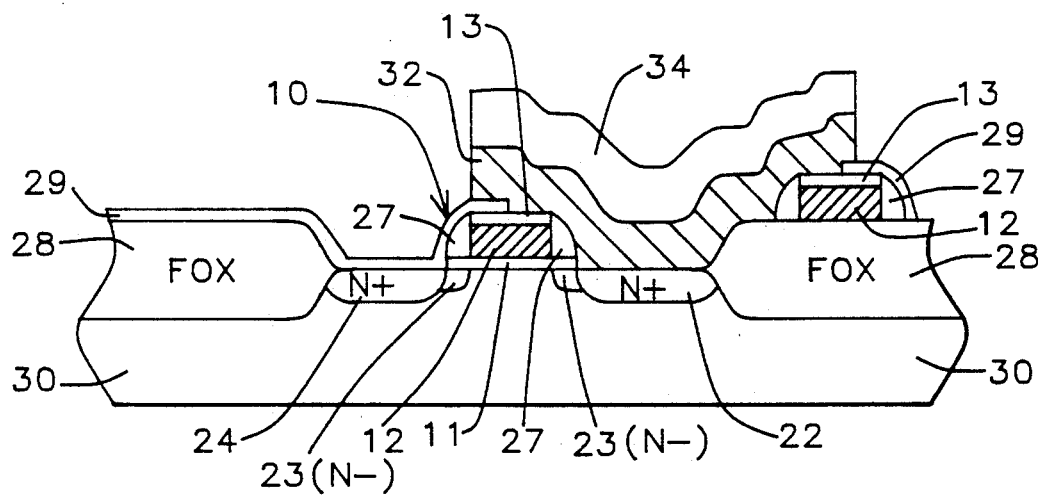

FIG. 3 shows the result of the deposition of the third silicon layer 34 which is typically polysilicon and is undoped. This layer will be the contact to the source/drain region 22. The layer is deposited by the method and conditions being low pressure chemical vapor deposition with temperatures between about 560° to 620° C. The thickness of this layer 34 is between about 2000 to 3000 Angstroms. Another lithography mask PR 35 as seen in FIG. 3 is formed over the layer 34. The purpose of this mask 35 is to allow patterning anisotropically the second silicon layer 32 and third silicon layer 34 so as to have their remaining portions over the planned capacitor areas which extends over both the portion of first polysilicon layer of the gate structure 11, 12, 13 and the field oxide 28 areas as seen in FIG. 4.

Figure 5:
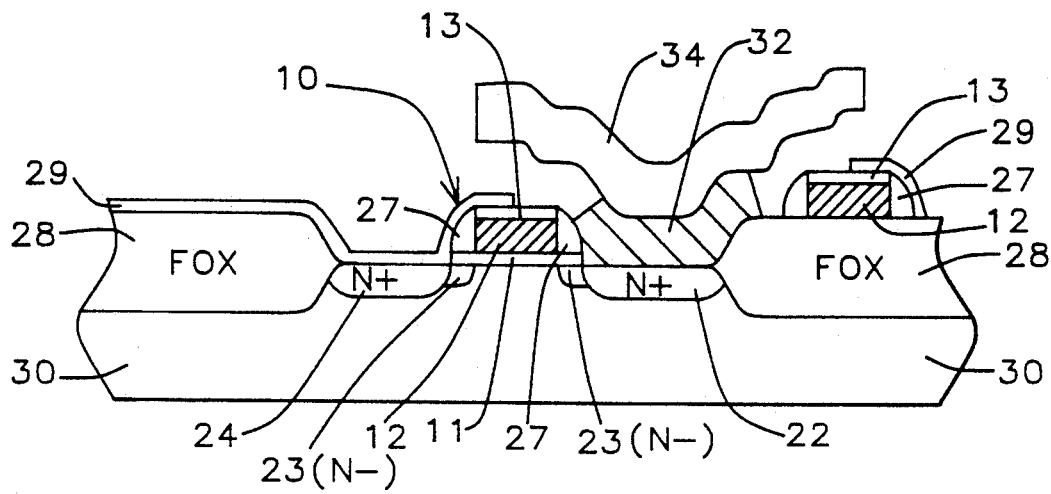

Referring now to FIG. 5 which shows the result of the selective etching of the heavily doped silicon layer 32 while leaving the undoped third silicon layer 34 in tact. This is the critical process of the capacitor formation. Phosphoric acid solution is preferably used to etch selectively the heavily doped layer 32 over the undoped layer 34. The layer 32 has been optimally prepared for the selective etching of it over the undoped layer 34 as described above. The etching is done using a phosphoric acid solution in water with a concentration of phosphoric acid (in water) between about 50 to 100% and preferably about 86±1.0%. The operative temperature of the etching process is between about 140 to 180 and preferably 155° to 165° C. for a time of more than about 100 minutes. The undercut shown in FIG. 5 will result in increased capacitance for the stacked capacitor of the invention. The undercut is preferred to extend under the third polysilicon layer between about 300 to 800 Angstroms. This completes the bottom node structure of the capacitor. The last step in this regard is to heavily dope this bottom node layer 34 by ion implantation with, for example phosphorus to a level of more than about 1 E 19 atoms/cm$^3$ or by simply heating the structure between about 800° to 900° C. uniformly diffuse the impurities from the heavily doped silicon layer 32 to the undoped layer 34.

Figure 6:
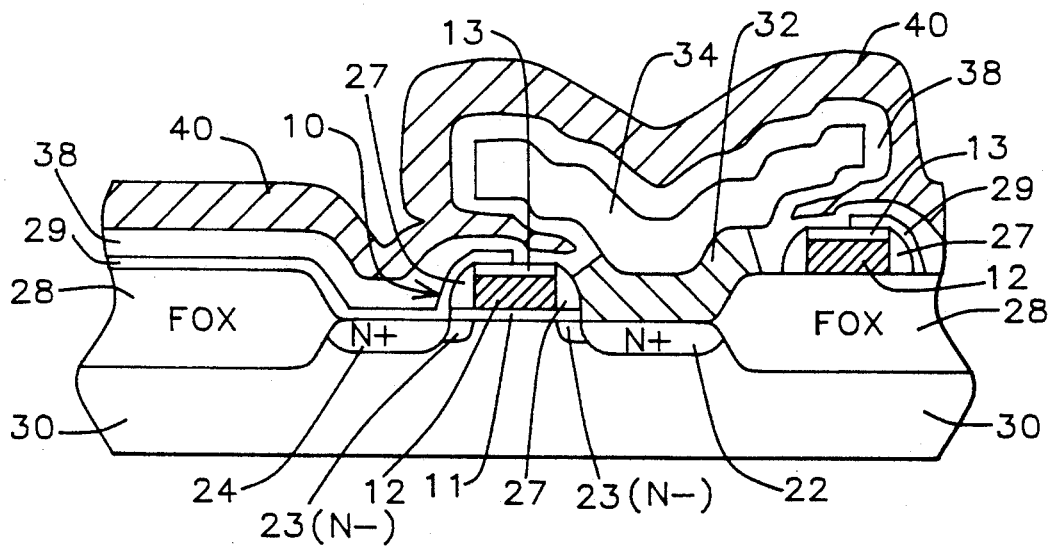

Referring now to FIG. 6, a thin dielectric layer 38 is deposited thereover. This layer serves as the capacitor dielectric. The thin dielectric or insulating layer has a thickness that is preferably in the range of about 30 to 250 Angstroms. The material of the dielectric layer can be of any suitable material having a high dielectric constant, and which forms a continuous, pinhole free layer. Preferably the dielectric layer is composite layer of a silicon oxide-silicon nitride-silicon oxide with a total thickness of between about 40 to 150 Angstroms. Alternatively, and of particular importance for the future is the dielectric tantalum oxide, such as tantalum pentoxide or in combination with silicon dioxide and/or silicon nitride.

The preferred thickness of tantalum oxide or tantalum pentoxide is between about 150 Angstroms to 1000 Angstroms. The materials are of particular importance, because of their high dielectric constant.

As shown in FIG. 6, a fourth polycrystalline silicon layer 40 is deposited over layer 38 and patterned together with layer 38 to serve as the top plate electrode 40. The fourth polycrystalline silicon layer is also doped with an impurity, preferably with a concentration in the range of about $10^{18}$ to $10^{21}$ cm.$^3$.

Figure 7:
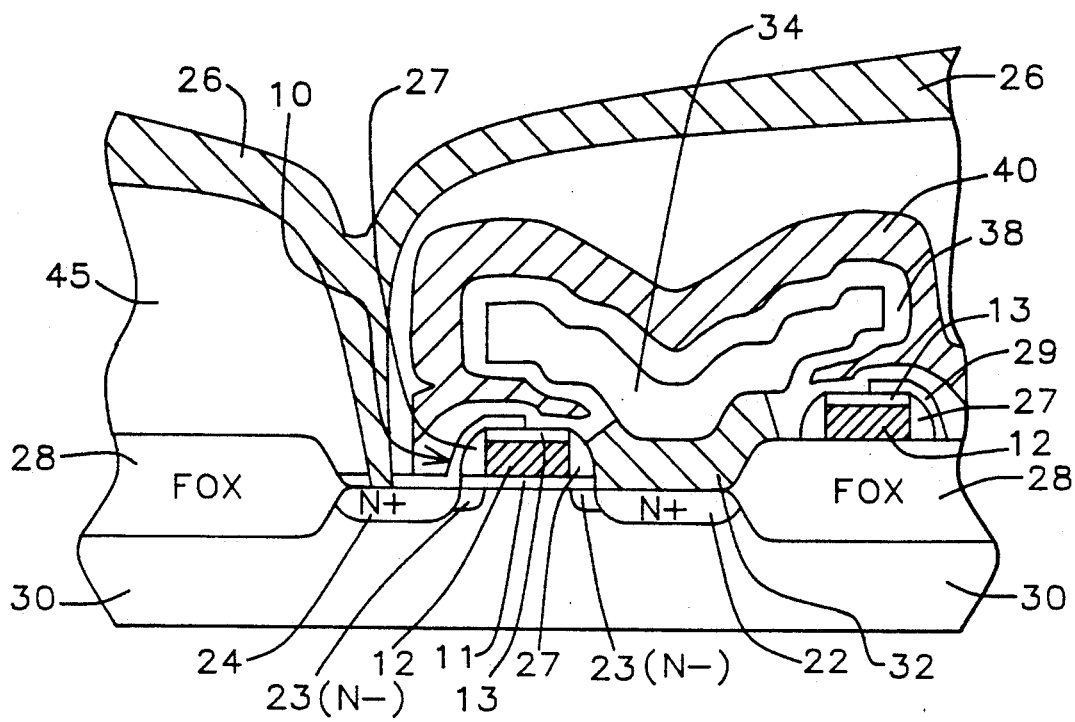

FIG. 7 shows the completion of the metal contacts to the monocrystalline silicon regions such as the bit line 26 contact to source regions 24. An insulating structure 45 may be composed of, for example a layer of silicon dioxide and a much thicker layer of borophosphosilicate glass, phosphosilicate glass or similar insulating layer. The operational thicknesses of these layers are between about 1000 to 2000 Angstroms for the oxide layer and between about 2000 to 10,000 or more Angstroms for the glasseous layer. These layers are typically deposited by chemical vapor deposition in low pressure or atmospheric pressure, or in a plasma enhanced reactive chamber.

The contact windows or openings are now formed through the insulating layered structure to the source regions 24 or the like in the device regions. The opening are not shown to the other regions, because they are outside of the cross-section of FIG. 7. This process step is conventionally done by lithography and etching techniques which preferably use a reactive ion etching process that will anisotropically etch both components of the insulating layer structure 45. A typical reactive ion etching process using fluorine containing etching chemical species. These oxide/glass layers etching processes are well known to those in the art. The size of the contact window opening can be as small as limitation of the etching and lithography patterning capability.

A bit line metal or composite metal layer or polycide composite layer (such as tungsten polycide) 26 is deposited over the exposed device region 24 and the insulating layer structure 45 both above and on the sides of the opening. This layer may be deposited by, for example chemical vapor deposition or sputtering. The operational thickness is between about 2000 to 10,000 Angstroms and the preferred thickness is between about 5000 to 7000 Angstroms. The thickness of this layer 26 is dependant upon the height and profile of the contact hole. This metal layer may be aluminum, aluminum-silicon, aluminum-silicon-copper, polycide, conducively doped polysilicon, tungsten or the like. Alternatively, a barrier metal layer (not shown) can be used under this metal layer.

Figure 8:
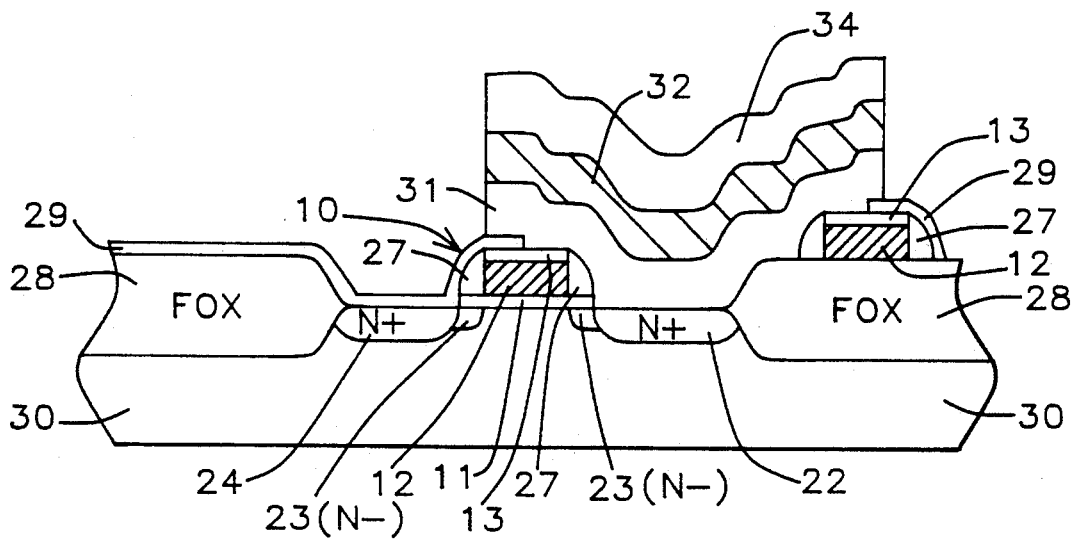
FIG. 8 through 10 schematically illustrate in cross-sectional representation a second process embodiment of the invention.
Figure 9:
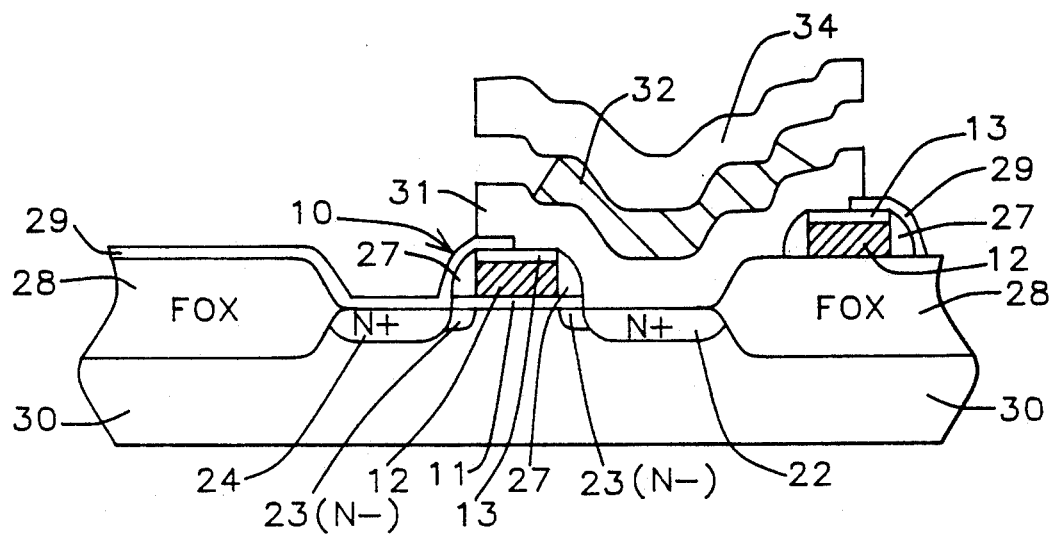
Figure 10:
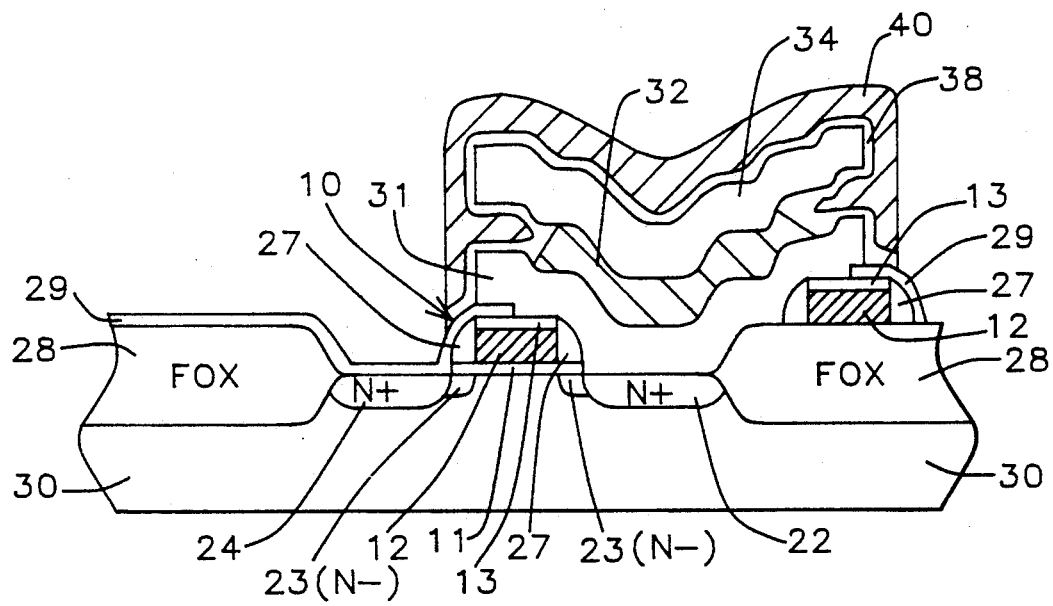

FIG. 8 through 10 shows a second process embodiment which further increases the stacked capacitor capacitance. Like numbers are intended to mean identical structures to that of the first embodiment. As can be seen from the FIG. 8, a layer of undoped polysilicon 31 is deposited over the source/drain 22 and extending over the first heavily doped polysilicon gate structure and heavily doped polysilicon structure over the FOX structure. A layer 32 of heavily doped silicon is deposited over the undoped layer 31. A second undoped layer 34 is deposited over the layer 32. The three layers are patterned by lithography and anisotropic etching to produce the FIG. 8 structure wherein the layers end at a point over the first heavily doped polysilicon gate structure and heavily doped polysilicon structure over the FOX structure. This establishes the extent of the bottom storage node electrode of the desired capacitor. Referring to FIG. 9, portions the heavily doped layer 32 is removed by selective etching as described in the FIGS. 1 through 7 process embodiment. The capacitor structure is thereafter formed as described above to form the completed FIG. 10. The contact to the source/drain region 24 can be made as described above and shown in the FIG. 7.

Figure 11:
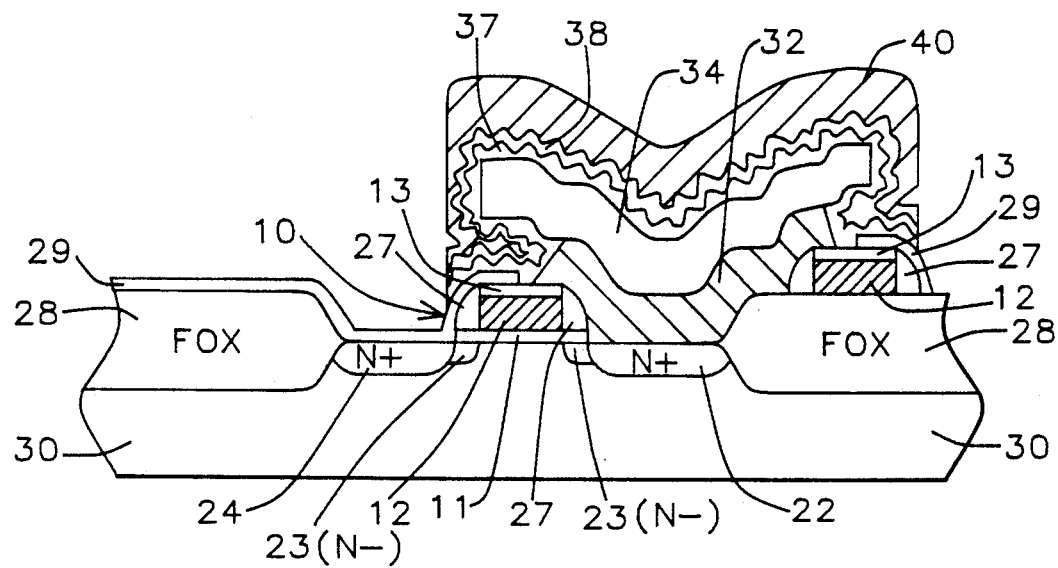
FIG. 11 schematically shows a method embodiment for increasing the capacitance of the above first and second embodiments by a roughening process.

FIG. 11 shows another embodiment which provides increased capacitance by forming another doped polysilicon layer 37 over the undercut structure of FIG. 5 before the deposition of the capacitor dielectric layer 38. This embodiment uses the roughening process described and claimed in U.S. application Ser. No. 07/994,501 filed Dec. 21, 1992, now U.S. Pat. No. 5,266,514 entitled "A METHOD OF DRAM STORAGE NODE FABRICATION" by H. M. CHOU and H. C. TUAN in our particular DRAM process. The layer is preferably formed using the deposition technique of conventional LPCVD processing at a temperature of less than about 600° C. to produce an amorphous silicon layer. An impurity is introduced into the silicon layer 37, either by ion implantation techniques or preferably by in situ doping. The impurity concentration in this layer 37 is critically between about 1 E 19 to 1 E 21 atoms per cm.$^3$. Phosphorus, arsenic and boron dopants are effective for the subsequent phosphoric acid solution etching process. It is this heavy doping concentration throughout the surfaces to be subsequently etched with phosphoric acid which allows for the success of the present method of fabricating a storage node. The silicon layer 37 is now annealed by furnace or rapid thermal anneal at an elevated temperature of greater than about 87520 and preferably more than 900° C. for, in the case of furnace anneal for a time greater than about 25 minutes to change any amorphous silicon in layer 37 to polycrystalline, uniformly distribute the dopant and develop the critical and desired grain size of the polycrystalline layer 37 to an average and substantially uniform grain size of between about 0.3 to 1.0 micrometers.

The critical phosphoric acid solution etching process of the polysilicon layer 37 is now done to produce the roughened surface on the layer 37 of the invention as is shown schematically in FIG. 11. The surface of the polysilicon layer 37 has been carefully prepared as described in the above paragraph. This is extremely important to give the uniformity and manufacturability of this roughening etching process. The polysilicon etching rate with phosphoric acid solution at the critical temperatures of between about 140° to 180° C. is reduced or slowed down after such a high temperature anneal as described in the preceding paragraph. The etching rate is dopant dependent and is between about 800 to 2000 Angstroms per hour for unannealed doped polysilicon and between about 200 to 800 Angstroms per hour for the critically annealed doped polysilicon layer. The etching rate after annealing is also more uniform. The critical composition of the phosphoric acid solution used is about 86±1.0% $H_3PO_4$ and 14 +/−1.0 $H_2O$. The preferred etching rate is between about 500 to 800 per hour using phosphoric acid solution at a temperature between about 140 to 180 and preferably 150° to 170° C. for time sufficient to reduce the thickness of the polysilicon layer 32 by between about 500 to 800 Angstroms and to produce the roughened surface as shown in FIG. 11. The remaining steps to complete the device would follow as described in the earlier embodiments.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a dynamic random access memory having a capacitor comprising:
   selectively forming field oxide areas on the surface of a semiconductor substrate while leaving device areas for fabrication of field effect devices having gate structures and source/drain structures;
   forming a gate dielectric layer on said substrate in the said device areas;
   depositing a first layer of polysilicon on the said field oxide areas and said device areas;
   removing portions of said first polysilicon layer while leaving portions thereof for the gate structure in said device areas, and portions over said field oxide areas; forming said source/drain structures within said device areas of said semiconductor substrate associated with said gate structures;
   forming a first oxide layer over said device and field oxide areas; and forming said capacitors by,
   forming openings to said source/drain structures by etching through said first oxide layer, wherein said openings extend over a portion of said first polysilicon layer of said gate structure and said field oxide areas,
   depositing a doped second silicon layer over the device and field oxide areas to contact said source/drain structures wherein the doping is greater than about 1 E 19 atoms per $cm^3$,
   depositing an undoped third polysilicon layer over said second doped silicon layer,
   patterning anisotropically said second silicon and third polysilicon layers so as to have their remaining portions over planned capacitor areas which include portions over said first polysilicon layer in said gate structure and said filed oxide areas,
   removing by selective etching with a phosphoric acid solution at a temperature of more than about 140° C. said portion of doped second silicon layer to create an undercut of said undoped third polysilicon layer over both the said portion of said first polysilicon layer of said gate structure and said field oxide areas and to construct the bottom storage node electrode of said desired capacitor,
   wherein the selectivity of etching the doped silicon layer versus said undoped polysilicon layer is greater than about 50 to 1 wherein a phosphoric acid solution is used at a temperature of more than about 140° C.,
   doping said remaining portions of said bottom storage node electrode,
   forming a capacitor dielectric layer over the said third polysilicon layer, and
   depositing a fourth polysilicon layer as the top plate electrode, and
   patterning said fourth polysilicon layer and said dielectric layer to complete said capacitor.

2. The method of claim 1 wherein the thickness of said first polysilicon layer is between about 2000 to 3000 Angstroms.

3. The method of claim 1 wherein the thickness of said second silicon layer is between about 1000 to 2000 Angstroms.

4. The method of claim 1 wherein the thickness of said third polysilicon layer is between about 2000 to 3000 Angstroms.

5. The method of claim 1 wherein the said phosphoric acid solution has a concentration of 50 to 100% in water.

6. The method of claim 1 wherein said etching occurs at a temperature of between about 140° and 180° C.

7. The method of claim 1 wherein said heavily doped second silicon layer is formed by in situ doped low pressure chemical vapor deposition.

8. The method of claim 1 wherein said second silicon layer is heated to assure uniform distribution of said impurity, optimum grain size of said silicon which is polycrystalline after said heating.

9. The method of claim 8 wherein said second silicon layer is in situ doped with a phosphorus impurity in a concentration of between about 1 E 19 to 1E 21 atoms/ $cm.^3$.

10. The method of claim 8 wherein said second silicon layer is deposited undoped and then doped by ion implantation with a phosphorus impurity in a concentration of between about 1 E 19 to 1 E 21 atoms/ $cm.^3$.

11. The method of claim 8 wherein said second silicon layer is deposited undoped and then doped by ion implantation with an arsenic impurity in a concentration of between about 1 E 19 to 1 E 21 atoms/ $cm.^3$.

12. The method of claim 8 wherein said second silicon layer is deposited undoped and then doped by ion implantation with a boron impurity in a concentration of between about 1 E 19 to 1 E 21 atoms/ $cm.^3$.

13. The method of claim 8 wherein said second silicon layer is deposited as amorphous silicon and is transformed into polycrystalline silicon during said heating.

14. The method of claim 8 wherein said first silicon layer is deposited as polycrystalline silicon and is transformed into a more uniform and optimum grain size during said heating.

15. The method of claim 8 wherein said heating is by furnace heating and is at a temperature of less than about 900° C. for more than about 25 minutes to optimize the grain size to between 500 to 1000 micrometers.

16. The method of claim 1 wherein said doping of the bottom electrode is made uniform by heating the structure between about 800° to 900° C. to uniformly distribute the impurities from the said heavily doped layer into said undoped layer.

17. The method of claim 1 wherein further comprising depositing a layer of silicon over the structure resulting from the said removing by selective etching said portion of doped second silicon layer to create an undercut of said undoped third polysilicon layer and to form a roughened surface is formed thereon by exposing the layer to phosphoric acid solution in water between about 50 to 100% phosphoric acid at an elevated temperature of above about 140° C. wherein etching occurs at the grain boundaries of said layer to cause a roughened polysilicon surface.

18. A method for fabricating a dynamic random access memory having a capacitor comprising:

selectively forming thick field oxide areas on the surface of a semiconductor substrate while leaving device areas for fabrication of field effect devices having gate structures and source/drain structures;

forming a gate dielectric layer on said substrate in the said device areas; depositing a first doped layer of polysilicon on the said field oxide areas and said device areas; removing portions of said first polysilicon layer while leaving portions thereof for the gate structure in said device areas, and portions over said field oxide areas;

forming said source/drain structures within said device areas of said semiconductor substrate associated with said gate structures;

forming a first oxide layer over said device and field oxide area; and forming said capacitors by, forming opening to said source/drain structures by etching through said first oxide layer, wherein said openings extend over a portion of said first polysilicon layer of said gate structure and said field oxide areas, depositing an first undoped polysilicon layer over the device and field oxide areas to contact said source/drain structures, depositing a doped second silicon layer over first undoped polysilicon layer to contact said source/drain structures wherein the doping is greater than about 1 E to 19 atoms per $cm^3$, depositing an second undoped polysilicon layer over said second heavily doped silicon layer, patterning anisotropically said second doped silicon, first undoped polysilicon layer and second undoped polysilicon layer so as to have their remaining portions over planned capacitor areas which include portions over said first doped polysilicon layer in said gate structure and said field oxide areas, removing by selective etching with a phosphoric acid solution at a temperature of more than about 140° C. said portion of doped second silicon layer to create an undercut of said undoped second polysilicon layer over both the said portion of said first heavily doped polysilicon layer of said gate structure and said field oxide areas and to construct the bottom storage node electrode of said desired capacitor, wherein the selectivity of etching the doped silicon layer versus said undoped polysilicon layer is greater than about 50 to 1 wherein a phosphoric acid solution is used at a temperature of more than about 140° C., doping said remaining portions of said bottom storage node electrode, forming a capacitor dielectric layer over the originally doped said second polysilicon layer, and depositing a top polysilicon layer as the top plate electrode, and patterning said top polysilicon layer and said dielectric layer to complete the capacitor.

* * * * *